US010032512B2

(12) United States Patent
Senoo et al.

(10) Patent No.: US 10,032,512 B2
(45) Date of Patent: Jul. 24, 2018

(54) NON-VOLATILE SEMICONDUCTOR MEMORY DEVICE

(71) Applicant: Winbond Electronics Corp., Taichung (TW)

(72) Inventors: Makoto Senoo, Kanagawa (JP); Seow-Fong Lim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/641,329

(22) Filed: Jul. 5, 2017

(65) Prior Publication Data

US 2018/0012655 A1  Jan. 11, 2018

(30) Foreign Application Priority Data

Jul. 5, 2016 (JP) .................................. 2016-133152

(51) Int. Cl.
*G11C 13/00* (2006.01)

(52) U.S. Cl.
CPC ...... *G11C 13/0069* (2013.01); *G11C 13/0023* (2013.01)

(58) Field of Classification Search
CPC .......... G11C 13/0069; G11C 13/0023
See application file for complete search history.

(56) References Cited

U.S. PATENT DOCUMENTS

| 2003/0214853 | A1* | 11/2003 | Hosono | G11C 16/3454 365/200 |
|---|---|---|---|---|
| 2004/0062130 | A1 | 4/2004 | Chiang | |
| 2005/0013162 | A1* | 1/2005 | Jeon | G11C 7/20 365/185.01 |
| 2008/0158993 | A1* | 7/2008 | Jung | G11C 16/3454 365/185.22 |
| 2009/0141567 | A1 | 6/2009 | Lee et al. | |
| 2009/0327800 | A1* | 12/2009 | Kim | G06F 11/1044 714/5.11 |
| 2010/0131708 | A1* | 5/2010 | Park | G11C 13/0069 711/115 |

(Continued)

FOREIGN PATENT DOCUMENTS

| JP | 2008041704 | 2/2008 |
|---|---|---|
| JP | 2012064286 | 3/2012 |

OTHER PUBLICATIONS

"Office Action of Taiwan Counterpart Application", dated Mar. 27, 2018, p. 1-p. 5.

*Primary Examiner* — Khamdan Alrobaie
(74) *Attorney, Agent, or Firm* — JCIPRNET

(57) ABSTRACT

A non-volatile semiconductor memory device includes a memory array 20, including a plurality of memory elements; a selection part, selecting the memory elements of the memory array based on address data; a mode selection part 30, selecting any one of a RAM mode and a flash mode, where the RAM mode is a mode adapted to overwrite data of the memory element according to writing data, and the flash mode is a mode adapted to overwrite data of the memory element when the writing data is a first value and prohibit overwrite when the writing data is a second value; and a write control part, writing the writing data to the selected memory element according to the RAM mode or the flash mode selected by the mode selection part 30.

11 Claims, 11 Drawing Sheets

(56) References Cited

U.S. PATENT DOCUMENTS

| | | | | |
|---|---|---|---|---|
| 2011/0157990 A1* | 6/2011 | Toyama | ................. | G11C 16/04 |
| | | | | 365/185.17 |
| 2013/0301345 A1* | 11/2013 | Noguchi | ............. | G11C 11/1675 |
| | | | | 365/158 |
| 2013/0322155 A1* | 12/2013 | Ahn | ................... | G11C 13/0002 |
| | | | | 365/148 |

* cited by examiner

NON-VOLATILE SEMICONDUCTOR MEMORY DEVICE

CROSS-REFERENCE TO RELATED APPLICATION

This application claims the priority benefit of Japan application serial no. 2016-133152, filed on Jul. 5, 2016. The entirety of the above-mentioned patent application is hereby incorporated by reference herein and made a part of this specification.

BACKGROUND OF THE INVENTION

Field of the Invention

The invention relates to a non-volatile semiconductor memory device, and particularly relates to write control of a semiconductor memory device including a memory array using variable resistance elements.

Description of Related Art

Regarding a non-volatile memory used for replacing a flash memory, a resistive variable memory using variable resistance elements draws a great attention. The resistive variable memory has an advantage of small power consumption due to that data can be overwritten by using with a voltage (with a micro current).

FIG. 1 is a circuit diagram of a typical structure of a memory array of conventional resistive variable memories. One memory cell unit includes a variable resistance element and an access transistor connected in series with the variable resistance element. When a memory cell unit M11 is written with data, the transistor is turned on through a word line WL1, and a setting or resetting voltage is applied to a bit line BL1 and a source line SL1. In this way, the variable resistance element is set or reset. In case of a read operation, the transistor is turned on through the word line WL1, and a read voltage is applied to the bit line BL1 and the source line SL1.

The resistive variable memory has advantages of low power consumption, high density, high-speed operation, etc. Presently, users require the resistive variable memory to have a specification compatible with that of the flash memory. In the flash memory and the resistive variable memory, processing for inputting data "1" is different, so that a following problem is encountered: an external host or the user cannot process the flash memory and the resistive variable memory by using the same specification.

SUMMARY OF THE INVENTION

The invention resolves the problem of the prior art, and the invention is directed to a non-volatile semiconductor device including operation modes having compatibility with other types of semiconductor memory device.

[Means for Resolving Problem]

The invention provides a non-volatile semiconductor memory device including a memory array including a plurality of memory elements; a selection part, selecting the memory elements of the memory array based on address data; an operation mode selection part, selecting any one of a first operation mode and a second operation mode, where the first operation mode is a mode adapted to overwrite data of the memory element according to writing data, and the second operation mode is a mode adapted to overwrite data of the memory element when the writing data is a first value, and prohibit overwrite when the writing data is a second value; and a write control part, writing the writing data to the memory element selected by the selection part according to the first operation mode or the second operation mode selected by the mode selection part.

[Effect of the Invention]

According to the invention, the memory elements can be written with writing data according to a plurality of operation modes, so as to gain compatibility for specification or writing of other types of semiconductor memory device.

In order to make the aforementioned and other features and advantages of the invention comprehensible, several exemplary embodiments accompanied with figures are described in detail below.

DESCRIPTION OF EMBODIMENTS

In following description, embodiments of the invention are described in detail with reference of figures. It should be noticed that in the figures, some parts are emphasized for easy understanding and are not necessarily drawn to scale.

[Embodiments]

Figure 2:
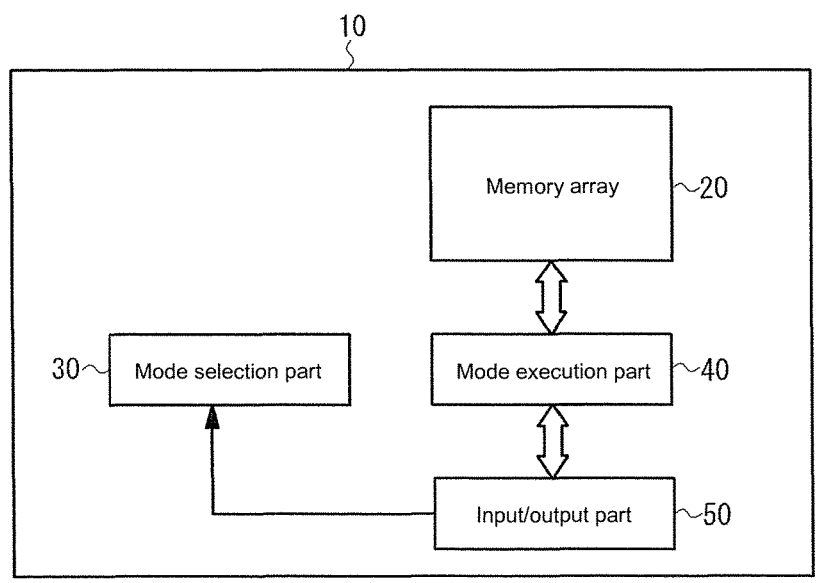
FIG. 2 is a structural block diagram of a non-volatile semiconductor memory device according to an embodiment of the invention.

FIG. 2 is a structural block diagram of a non-volatile semiconductor memory device according to an embodiment of the invention. As shown in FIG. 2, the non-volatile semiconductor memory device 10 includes a memory array 20, which includes non-volatile memory elements arranged in a matrix; a mode selection part 30, which selects an operation mode of the non-volatile semiconductor memory device 10; a mode execution part 40, which is adapted to operate according to the operation mode selected by the mode selection part 30 from a plurality of operation modes; and an input/output part 50, which is adapted to implement data, address, etc. input/output with external.

The mode selection part 30, for example, receives a mode selection signal from external through the input/output part 50, and selects one operation mode from a plurality of operation modes according to the mode selection signal. When a host device is connected with a plurality of the non-volatile semiconductor memory devices 10, the host device may output a plurality of mode selection signals to the non-volatile semiconductor memory devices 10. Now, the non-volatile semiconductor memory devices 10 may respectively have different types, and the mode selection signals adapted to make the non-volatile semiconductor memory devices 10 to respectively operate in a mode having compatibility can be output.

The mode execution part 40 has a structure adapted to execute a plurality of operation modes, and is adapted to perform a write or read operation according to the operation mode selected by the mode selection part 30. The mode execution part 40 supports a plurality of operation modes, and is adapted to arbitrarily select the operation mode. In this way, the non-volatile semiconductor memory device 10 may correspond to a plurality of operation modes of the semiconductor memory device.

Figure 3:
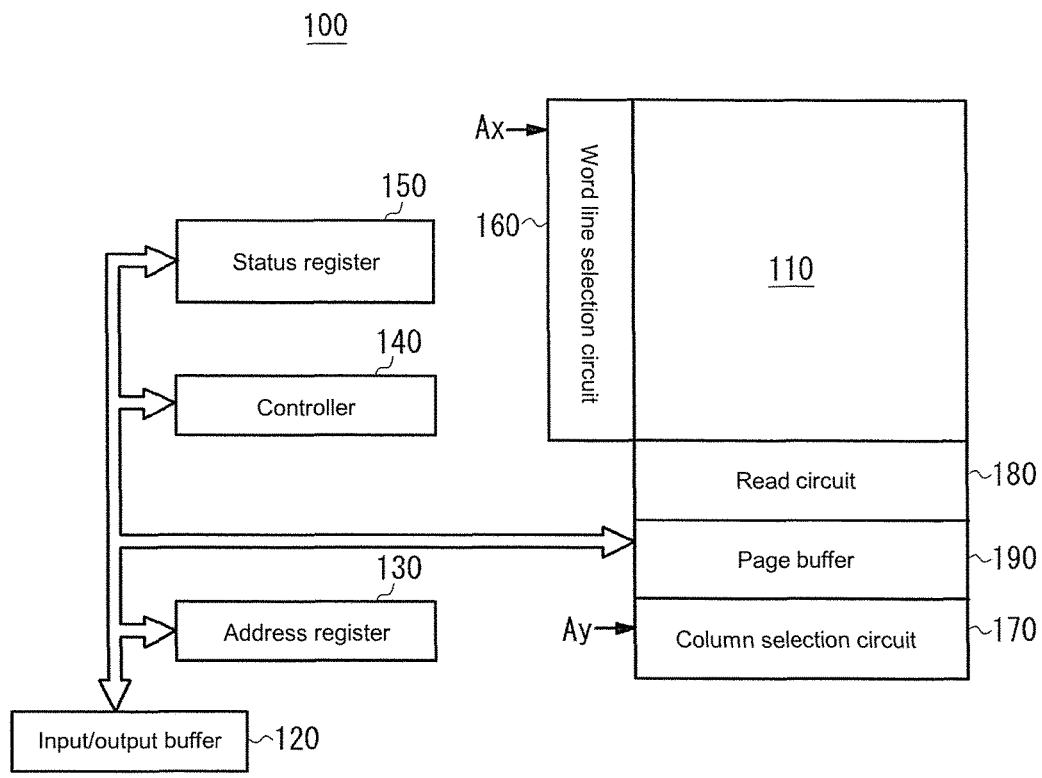
FIG. 3 is a structural diagram of a non-volatile semiconductor memory according to an embodiment of the invention.

Then, a non-volatile semiconductor memory of a preferred form of the present embodiment is described below. FIG. 3 is a structural diagram of a non-volatile semiconductor memory of the present embodiment. The non-volatile semiconductor memory 100 includes a memory array 110, which is configured with a plurality of variable resistance elements arranged in a matrix; an input/output buffer 120, which is connected to an external input/output terminal I/O to receive input/output data; and address register 130, which receives address data coming from the input/output buffer 120; a controller 140, which controls various parts according to command data coming from the input/output buffer 120; a status register 150, which selects an operation mode according to a command or external control signal, and holds selection information of the operation mode; a word line selection circuit 160, which decodes row address information Ax coming from the address register 130, and selects and drives word lines according to a decoding result; a column selection circuit 170, which decodes column address information Ay coming from the address register 130, and selects and drives bit lines according to a decoding result; a read circuit 180, which detects signals read from the selected variable resistance elements, or holds writing data of the selected variable resistance elements; and a page buffer 190, which holds input/output data. Moreover, although not illustrated, the non-volatile semiconductor memory 100 further includes a voltage generation circuit, and the voltage generation circuit generates bias voltages required for setting, resetting, read operations of the variable resistance elements, and provides the same to the word line selection circuit 160 and the read circuit 180, etc.

Figure 1:
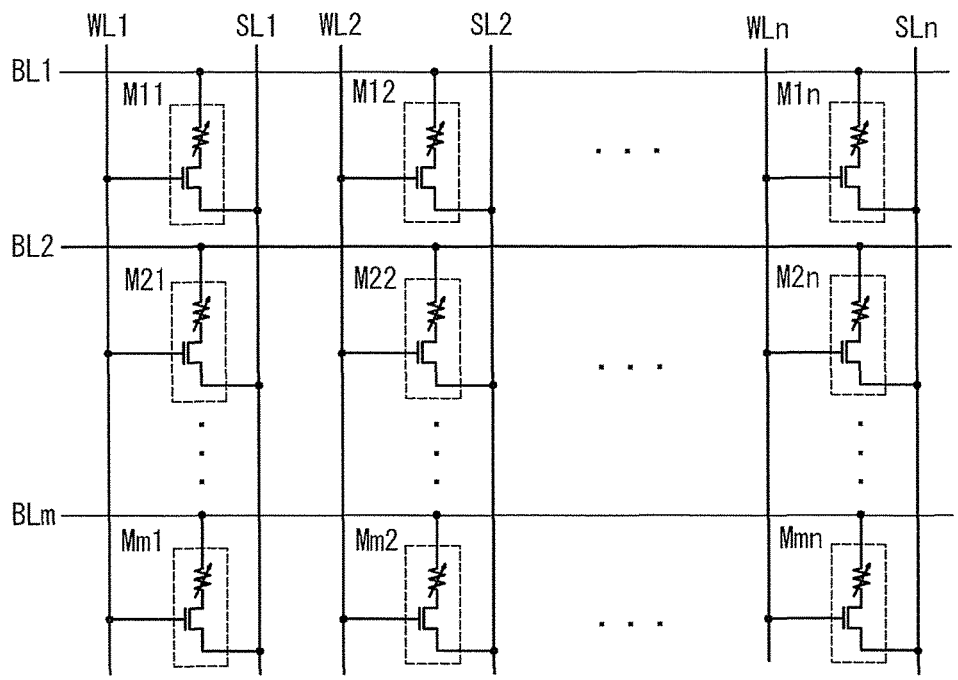
FIG. 1 is a diagram of an array structure of conventional resistive variable memories.

The memory array 110 is as that shown in FIG. 1, and includes a plurality of memory elements M11, M12, . . . , Mmn arranged in an array, where one memory element includes a variable resistance element and a selection transistor. The variable resistance elements and the selection transistors are connected in series between the bit lines BL and the source lines SL, and gates of the selection transistors are connected to the word lines.

A state that the variable resistance element is set corresponds to any one of data "0" or data "1", and a state that the variable resistance element is reset corresponds to any one of data "1" or data "0". The controller 140 controls a write (setting, resetting) operation or a read operation based on a command coming from external. The word line selection circuit 160 selects the word lines according to the row address information Ax received from external, and the column selection circuit 170 selects the bit lines according to the column address information Ay received from external. Through the control of the controller 140, bias voltages are applied to the selected word lines, bit lines and source lines in case of the write (setting, resetting) operation or the read operation.

The non-volatile semiconductor memory 100 of the present embodiment includes a plurality of operation modes, and may operate according to the selected operation mode. The status register 150 stores selection information of the operation modes, and the controller 140 controls the read or write operation according to the selection information stored in the status register 150. In a preferred exemplary embodiment, the non-volatile semiconductor memory 100 may operate in an operation mode (referred to as a flash mode hereinafter) compatible to a NOR flash memory, or an operation mode (referred to as a RAM mode hereinafter) compatible to a memory adapted for random access and overwriting the memory elements by writing data, the status register 150 stores flag information used for identifying the flash mode and the RAM mode. The flash mode or the RAM mode can be selected through the command coming from the input/output buffer 120 or a control signal provided to the external terminal of the non-volatile semiconductor memory 100.

Figure 4:
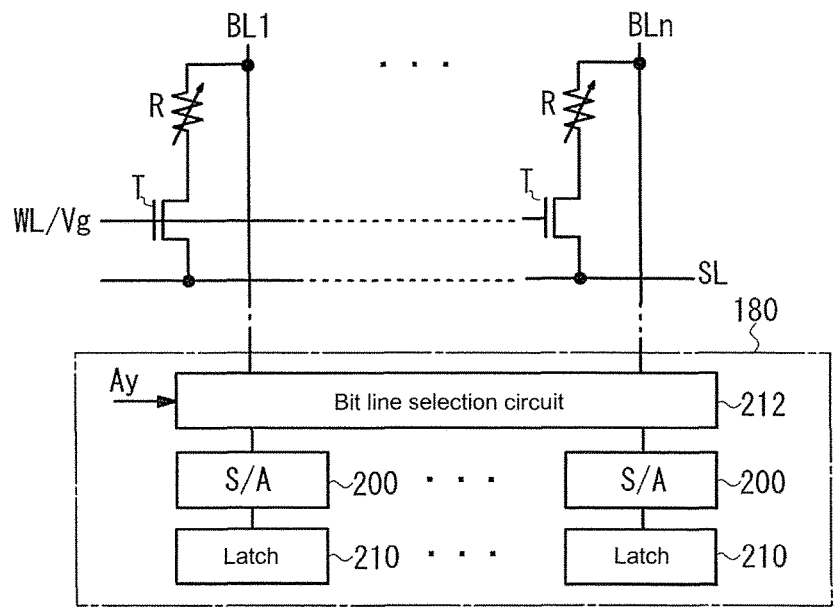
FIG. 4 is a structural diagram of a memory array according to an embodiment of the invention.

FIG. 4 is a structural diagram of memory elements and the read circuit 180. One memory element has a variable resistance element R and a selection transistor T connected in series between the source line SL and the bit line BL. A word line WL is commonly connected to gates Vg of the selection transistors T. In the example of FIG. 4, the memory elements of n bits are arranged along a row direction, and the bit lines BL1-BLn of the memory elements of n bits are connected to the read circuit 180. The read circuit 180 includes a bit line selection circuit 212 used for selecting one or a plurality of bit lines according to the column address information Ay. Further, the read circuit 180 includes sense amplifiers (S/A) 200 and latches 210 connected to each of the bit lines through the bit line selection circuit 212. In the read operation, the word line selection circuit 160 selects a row according to the row address information Ax, the bit line selection circuit 212 selects a bit line according to the column address information Ay, and the sense amplifier 200 detects a voltage or a current on the bit line of the selected memory element, and stores the same in the latch 210. Moreover, in the write operation, the writing data is held in the latch 210 from the input/output buffer 120 through the page buffer 190, and the held writing data is written into the memory element selected according to the row address information Ax and the column address information Ay.

Figure 5A:
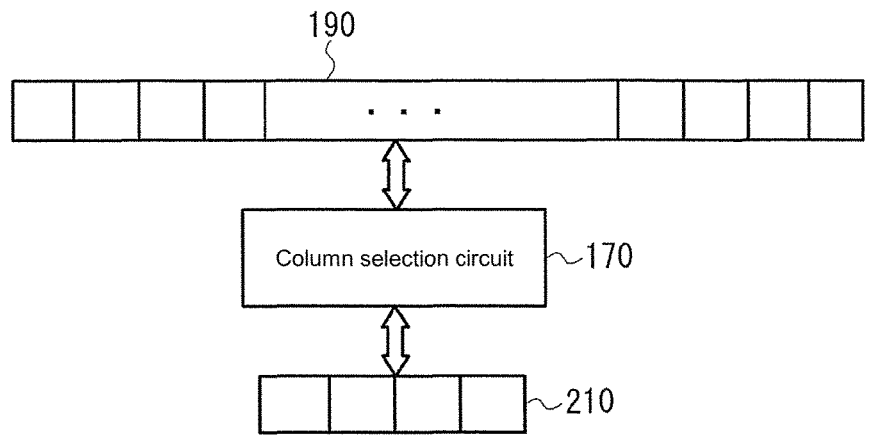
FIG. 5(A) is a diagram illustrating a relationship of a page buffer, a column selection circuit and a latch.
Figure 5B:
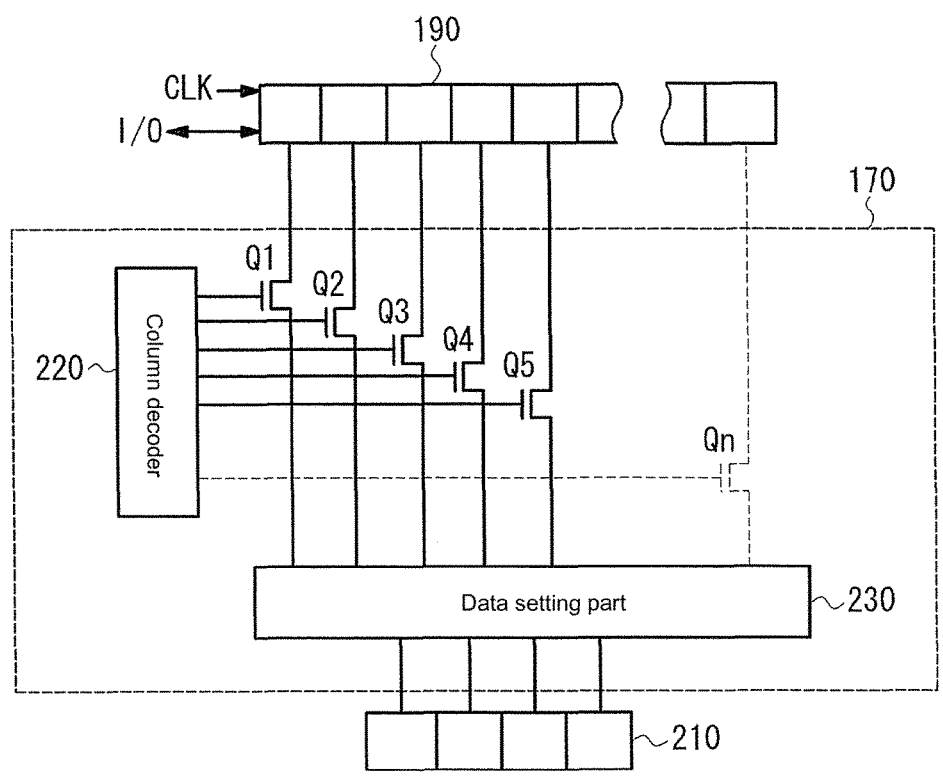
FIG. 5(B) is a diagram of a structure of the column selection circuit.

FIG. 5(A) is a diagram illustrating a relationship of the page buffer 190, the column selection circuit 170 and the latch 210, and FIG. 5(B) is a diagram of an internal structure of the column selection circuit. The page buffer 190 may, for example, perform two-way data transmission with the input/output buffer 120 in synchronization with an internal clock signal CLK. The column selection circuit 170 sets data held in the page buffer 190 to the latch 210 or sets data held in the latch 210 to the page buffer 190 according to an input column address. The latch 210 may perform two-way data transmission with the sense amplifier 200.

The column selection circuit 170 includes a column decoder 220, which is adapted to decode the column addresses; and a data setting part 230, which is adapted to set the data held by the page buffer 190 to the latch 210, or set the data held by the latch 210 to the page buffer 190.

The non-volatile semiconductor memory 100 of the present embodiment may implement the data reading or writing operation in unit of bit. In case of the write operation performed in unit of bit, the column decoder 220 turns on any of the transistors Q1-Qn based on a decoding result of the column address, and data of one bit of the page buffer 190 is set or loaded to the latch 210 by the data setting part 230. On the other hand, in case of the write operation performed in unit of bit, the column decoder 220 turns on any of the transistors Q1-Qn based on a decoding result of the column address, and reading data of one bit of the latch 210 is set or loaded to the page buffer 190 by the data setting part 230.

In a preferred exemplary embodiment, the non-volatile semiconductor memory 100 may implement the data reading or writing operation in unit of bits, in unit of byte or in unit of word. In a preferred exemplary embodiment, the page buffer 190 may hold data of n bits equivalent to a bit number of the memory elements in a row direction (i.e. data of one page). In the following description, for example, read and write operations of data of p bits (p<n) are described below.

In view of the write operation, the writing data of one page coming from the input/output buffer 120 and the internal clock signal CLK are synchronously and serially input to the page buffer 190. The column decoder 220 turns on p transistors in the transistors Q1-Qn based on the input column addresses, and the writing data of p bits selected from the page buffer 190 is set in the latch 210 by the data setting part 230. The writing data of p bits set to the latch 210 is simultaneously written into the selected memory elements of p bits (the selected memory elements are set or reset) through the sense amplifier 200 and the bit line selection circuit 212.

In view of the read operation, the reading data of p bits read from the selected memory elements through the bit line selection circuit 212 is read by the sense amplifier 200, and is held in the latch 210. In an example, the column decoder 220 turns on p transistors in the transistors Q1-Qn based on the decoding result of the input column addresses, and the reading data of p bits sets in the page buffer 190 by the data setting part 230. The reading data held by the page buffer 190 and the internal clock signal CLK are synchronously and serially output to the input/output buffer 120. In the above example, the reading data is read through the page buffer 190, though the invention is not limited thereto, and based on the decoding result of the column decoder 220, the reading data held by the latch 210 can be directly transmitted to the input/output buffer 120 without through the page buffer 190. In this case, since the page buffer 190 does not participate, high-speed reading can be implemented.

Moreover, the page buffer 190 is not limited to a page size, and may also hold data with a size different to the page size. Moreover, the page buffer 190 may include a static random access memory (SRAM) suitable for a high-speed operation or a data register. If the number of the memory elements used for implementing one write or read operation is increased, the power consumption is increased in proportion, so that the size of p bits can be limited by a peak of the allowed power consumption.

Figure 5C:
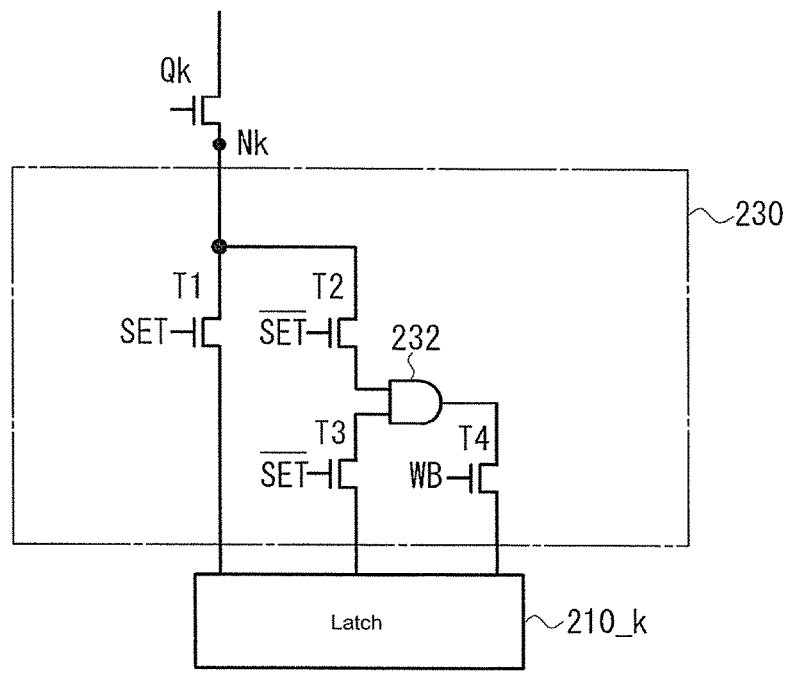
FIG. 5(C) is a diagram of an example of a data setting part of the embodiment.

FIG. 5(C) illustrates a structure of the data setting part 230. The data setting part 230 is connected between a node Nk of any of the transistors Q1-Qn and a latch 210_k storing data of one bit, and includes N-channel metal oxide semiconductor (NMOS) transistors T1, T2, T3, T4 and an AND gate 232. Each gate of the transistors T1, T2, T3 is connected to a setting signal SET with a logic level corresponding to the write operation or the read operation and the flash mode or the RAM mode. For example, in an embodiment, when the RAM mode is selected in the write operation, the setting signal SET is driven to an H level to turn on the transistor T1 and turn off the transistors T2 and T3. Therefore, one bit data of the node Nk, i.e. the page buffer 190 can be set to the latch 210_k through the transistor T1. On the other hand, when the flash mode is selected in the write operation, the setting signal SET is driven to an L level to turn off the transistor T1 and turn on the transistors T2 and T3. Therefore, one bit data of the node Nk is not set to the latch 210_k, but is supplied to one of input terminals of the AND gate 232 through the transistor T2. Accordingly, the transistor T3 is turned on, and the reading data held by the latch 210_k is supplied to another input terminal of the AND gate. Moreover, the gate of the transistor T4 is connected to a write back signal WB, and when the write back signal WB has the H level, an output of the AND gate 232 can be set to the latch 210_k.

Moreover, in an example, in case of the read operation, the setting signal SET has the H level, and the reading data held by the latch 210_k can be set to the node Nk, i.e. the page buffer 190 through the transistor Q10.

Figures 6A, 6B:
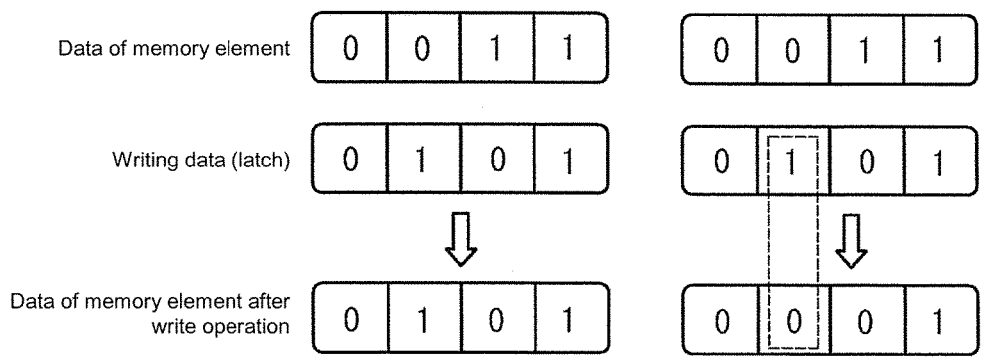
FIG. 6(A) is an example of writing data under a RAM mode.
FIG. 6(B) is an example of programming a general flash memory.

FIG. 6(A) is an example of writing 4 bits (P=4) in case of the write operation of the RAM mode, which is an example, that the selected memory elements of 4 bits are stored with data "0011", the writing data "0101" of 4 bits is set in the latch 210, and the writing data of 4 bits is written. In the RAM mode, the memory elements are directly overwritten with the writing data "0101", so that the data in the written memory elements is the same to the writing data.

FIG. 6(B) is an example of programming a general flash memory. In the flash memory, data "1" represents that the memory element is in an erase state, data "0" represents that the memory element is in a program state, and in the writing operation, when the writing data (programming data) is "1", programming of the corresponding memory element is prohibited. Therefore, when the writing data is "0", the data of the memory element is overwritten according to the writing data, though when the writing data is "1", the data of the memory element is not overwritten. In the case of FIG. 6(B), the data stored in the memory element is "0", and when the writing data is "1", the data in the written memory element is still "0", which is different to the writing data "1".

In the non-volatile semiconductor memory 100, in order to achieve compatible writing of the flash memory, in the example of FIG. 6(A), the data of the written memory elements has to be "0001". In one solution, as long as logic AND of the data stored in the selected memory elements and the writing data is determined, the data of the selected memory elements can be overwritten according to the data of the logic AND. Therefore, when the column selection circuit 170 of the present embodiment selects the flash memory in the write operation, the logic AND of the writing data and the reading data read from the selected memory elements is calculated, and the write operation is performed according to the data of the logic AND.

Figure 7:
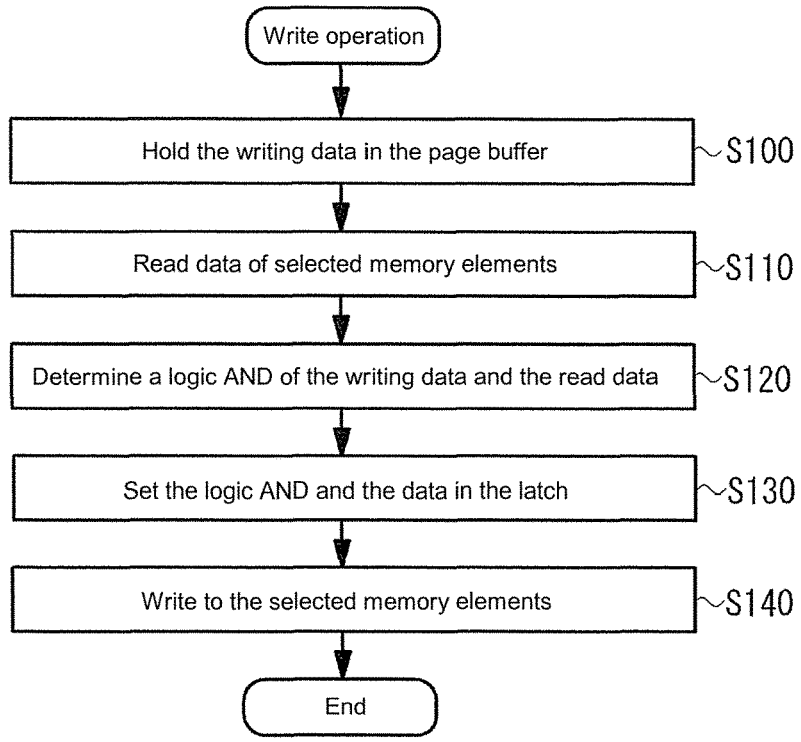
FIG. 7 is a flowchart illustrating a write operation of a flash mode according to an embodiment of the invention.
Figure 8:
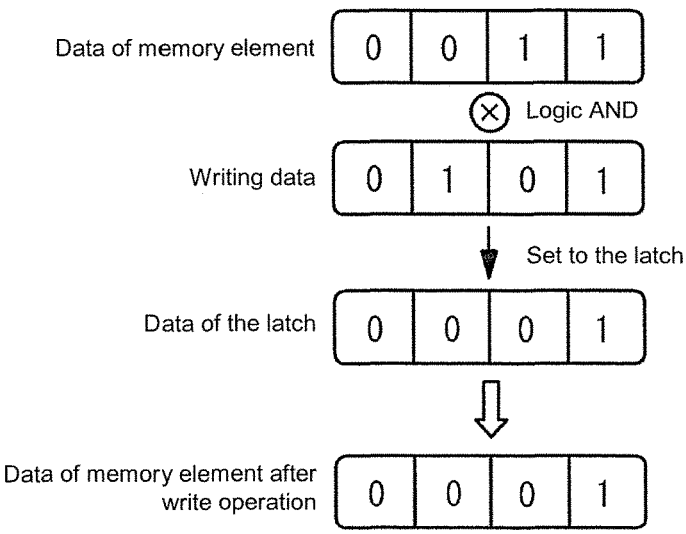
FIG. 8 is an example of writing data in case of the flash mode according to an embodiment of the invention.

FIG. 7 is a flowchart illustrating a write operation of a flash mode, and FIG. 8 is a conversion example of writing data in case of the flash mode. First, and external host device outputs a command, address data and writing data of the write operation to the non-volatile semiconductor memory 100, and the page buffer 190 holds the writing data (S100). Then, under control of the controller 140, data of memory elements of p bits selected according to row addresses and column addresses is read (S110), and is held in the latch 210.

Then, the data setting part 230 determines a logic AND of the writing data and the reading data (S120). For example, referring to FIG. 5(C), since the setting signal SET has the L level, the transistor T2 is turned on, and the writing data of the node Nk is supplied to one of the input terminals of the AND gate 232, and since the transistor T3 is turned on, the data of the latch 210_k is supplied to another input terminal of the AND gate 232.

Then, the determined data of the logic AND is set in the latch 210 (S130). As shown in FIG. 5(C), the write back signal WB is driven to the H level, and the output of the AND gate 232 is set in the latch 210_k.

Then, the data of 4 bits held by the latch 210_k is transmitted to the sense amplifier 200, and the sense amplifier 200 sets, resets the selected memory elements according to the writing data, and overwrites the same with the writing data (S140). As a result, as shown in FIG. 8, the data of the written memory elements is "0001", which is a same writing result as that of the flash memory.

Figure 9:
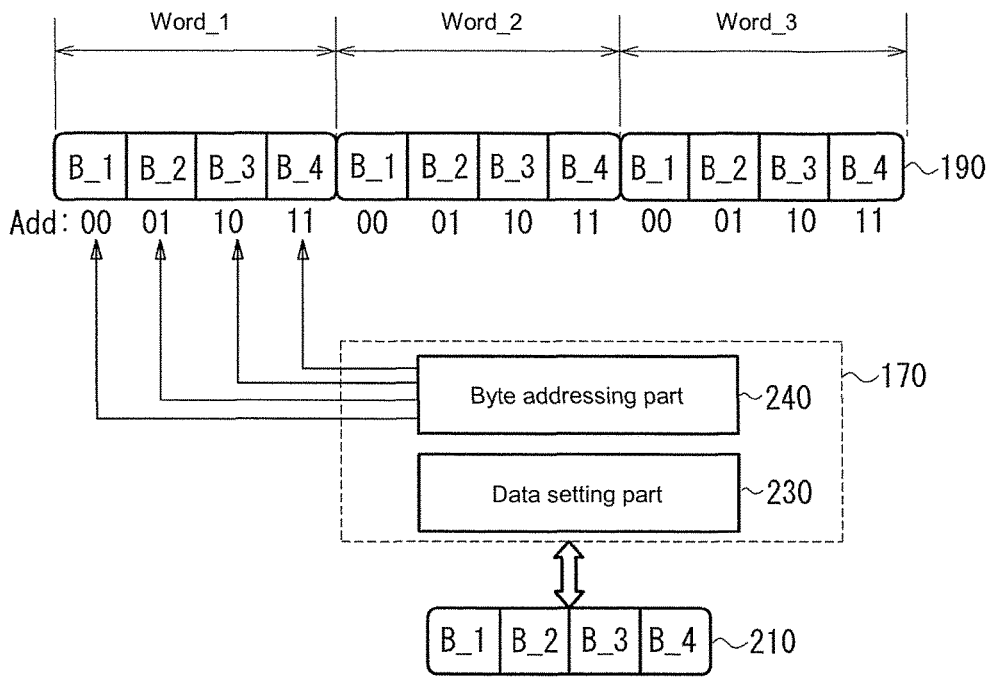
FIG. 9 is a diagram of a structure of a column selection circuit 170 according to a second embodiment of the invention.

Then, a second embodiment of the invention is described below. Read/write operations of data with a size corresponding to the size of data processed by a processor in a host device side can be performed to the non-volatile semiconductor memory 100 of the second embodiment. For example, when the host device performs data processing in unit of word of 32 bits, the non-volatile semiconductor memory 100 may perform the read/write operations in unit of word. FIG. 9 is a diagram of read/write operations performed in unit of word of 32 bits. The page buffer 190 of FIG. 9, for example, holds data of 3 words.

The column selection circuit 170 includes a byte addressing part 240, and the byte addressing part 240 addresses the bytes of the page buffer 190 based on column addresses. The byte addressing part 240 adds an increment to the address of two bits based on the decoding result of the column address, so as to implement addressing in the unit of bytes. For example, a byte B_1 is accessed at an address "00", and then a byte B_2 is accessed at an address "01", and the addresses "00", "01", "10" and "11" are taken as a cycle to access four bytes (one word). The data setting part 230 sets the byte data accessed by the byte addressing part 240 in the latch 210, or sets the byte data read from the selected memory elements and held by the latch 210 in the page buffer 190. The example of FIG. 9 shows that four bytes of a word_1 is set in the latch 210. The byte addressing part 240 may sequentially access a word_2 and a word_3 after accessing the word_1. In this way, the read/write operations performed in the unit of word is implemented.

Figure 10:
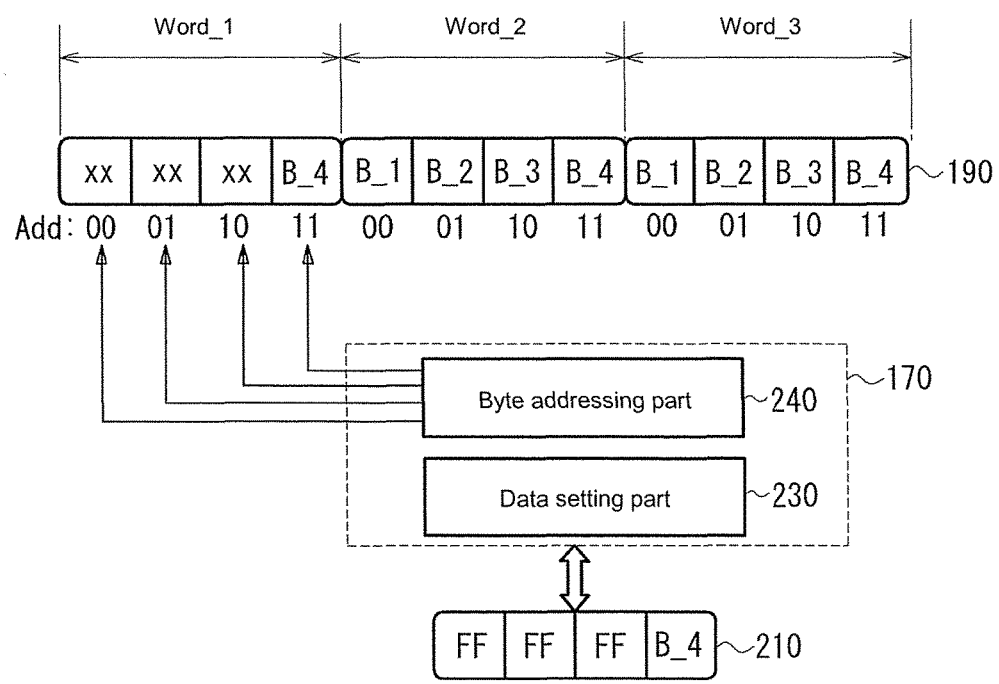
FIG. 10 is an example of writing bytes with unaligned data format in the flash mode according to the second embodiment of the invention.

Accordingly, the non-volatile semiconductor memory 100 of the present embodiment may not only perform the read/ write operations in the unit of word, but may also perform the read/write operations in unit of a part of the word including a data format with unaligned four byte data. For simplicity's sake, the data with the format with unaligned four byte data is referred to as unaligned word data. FIG. 10 is an example of writing the unaligned word data in the flash mode, where the word_1 includes data B_4 of a fourth byte, and only the data B_4 is written. The byte addressing part 240 detects the column address "11" of the word_1, i.e. the byte B_4 based on the column address input from the host device.

When the write operation is performed in the flash mode, the data setting part 230 initializes all of the bytes of the latch 210 to "1" (FF). When the byte addressing part 240 detects that the byte B_4 of the word_1 is valid, the data setting part 230 reads the data of the byte B_4 based on the detection result, and sets the data to the corresponding fourth byte of the latch 210. As a result, in the latch 210, the bytes B_1-B_3 are set with data FF, and the byte B_4 is set with the writing data. Under the flash mode, the data "1" is for prohibiting programming, i.e. still maintaining the data of the memory element, and the data set in the latch 210 is the same to the first embodiment, and a logic AND with one word data read from the selected memory elements of the memory array is determined, and the one word data converted through the logic AND is written to the selected memory elements.

Figure 11:
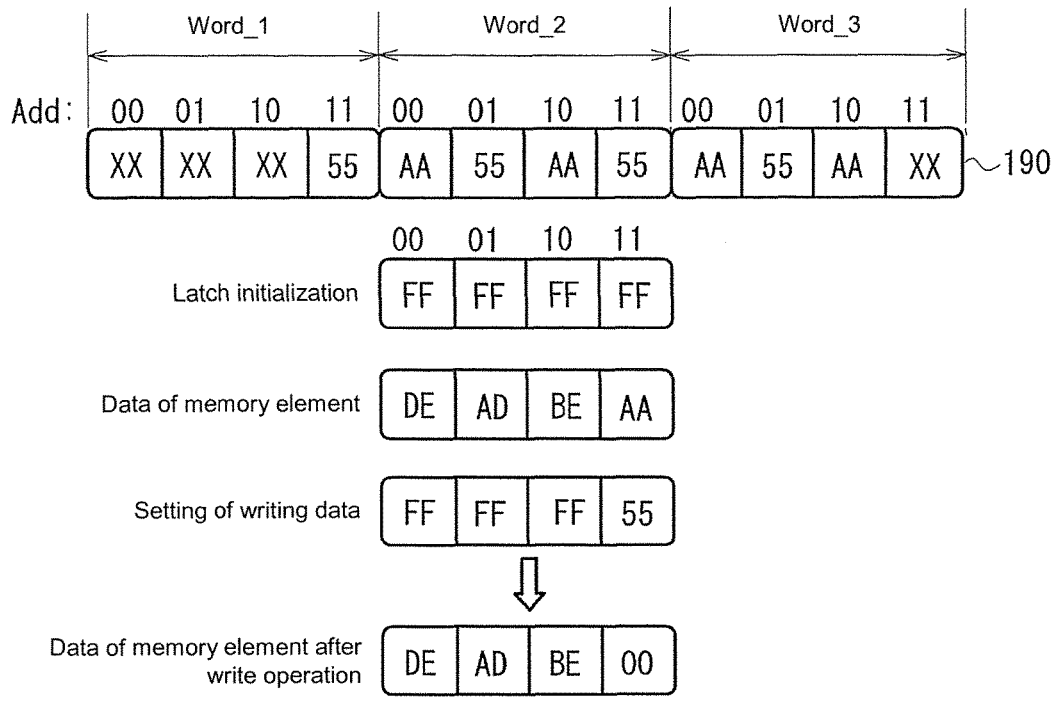
FIG. 11 is an example of writing bytes with unaligned data format in the flash mode according to the second embodiment of the invention.

FIG. 11 is an example of writing data "55" (hexadecimal) of the fourth byte of the word_1. First, the latch 210 is initialized to data "1". The data setting part 230 sets the data "55" load from the fourth byte of the page buffer 190 in the latch 210. Moreover, a logic AND of the data set in the latch 210 and one word data read from the selected memory elements is determined, and the data of the logic AND is written to the selected memory elements. As a result, the data of the selected memory elements corresponding to the bytes 1-3 is still maintained to original data, and only the data of the selected memory element corresponding to the fourth byte is overwritten.

On the other hand, in case of the RAM mode, when the latch 210 is also initialized to data "1" (FF) similar to the flash mode, the data of the memory elements is overwritten according to the initialized data. Namely, regarding the example of FIG. 11, according to the initialized data of the bytes B_1-B_3, the data of the corresponding selected memory elements are all overwritten to "1", which results in a fact that the data stored in the memory elements is lost.

Figure 12:
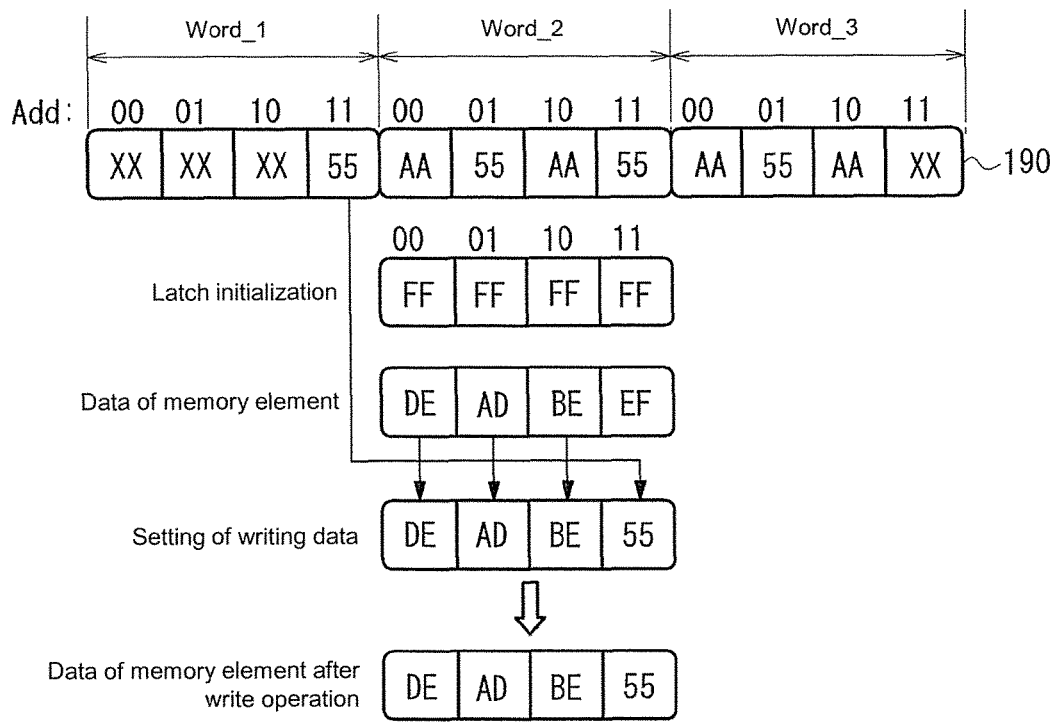
FIG. 12 is an example of writing byte data with unaligned format in the RAM mode according to the second embodiment of the invention.

Therefore, in case of the RAM mode of the present embodiment, as shown in FIG. 12, the latch 210 is initialized, and the data of the selected memory elements is read, and held in the latch 210, and the data setting part 230 loads the data "55" of the fourth byte of the word_1 to the corresponding fourth byte of the latch 210. The writing data set in such way is written to the selected memory elements. In this way, data of the memory elements is not destroyed, and the memory elements may continually hold the stored data, and only the data of the memory element of the fourth byte is overwritten. If the word_2 of the format with aligned four byte data is included between the word_1 and the word_3, the data setting part 230 selectively sets the data read from the memory elements and the data held by the page buffer 190 in the latch 210. Details of such operation are described later.

Figure 13:
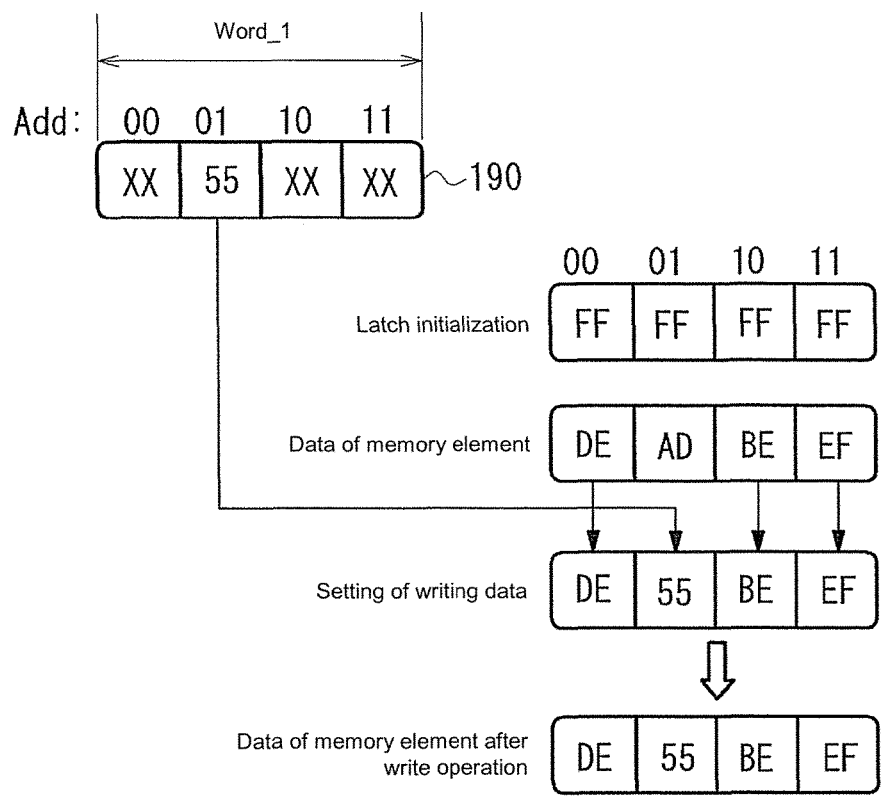
FIG. 13 is an example of random writing of bytes in the RAM mode according to the second embodiment of the invention.

FIG. 13 is another writing example under the RAM mode, i.e. a random writing example of byte. The byte addressing part 240 detects that the address of the second byte in the word_1 is valid based on the input column address, and based on such result, the data setting part 230 loads the data of the second byte to the second byte of the latch 210. Other operations are the same to that of the example of FIG. 12.

Figure 14:
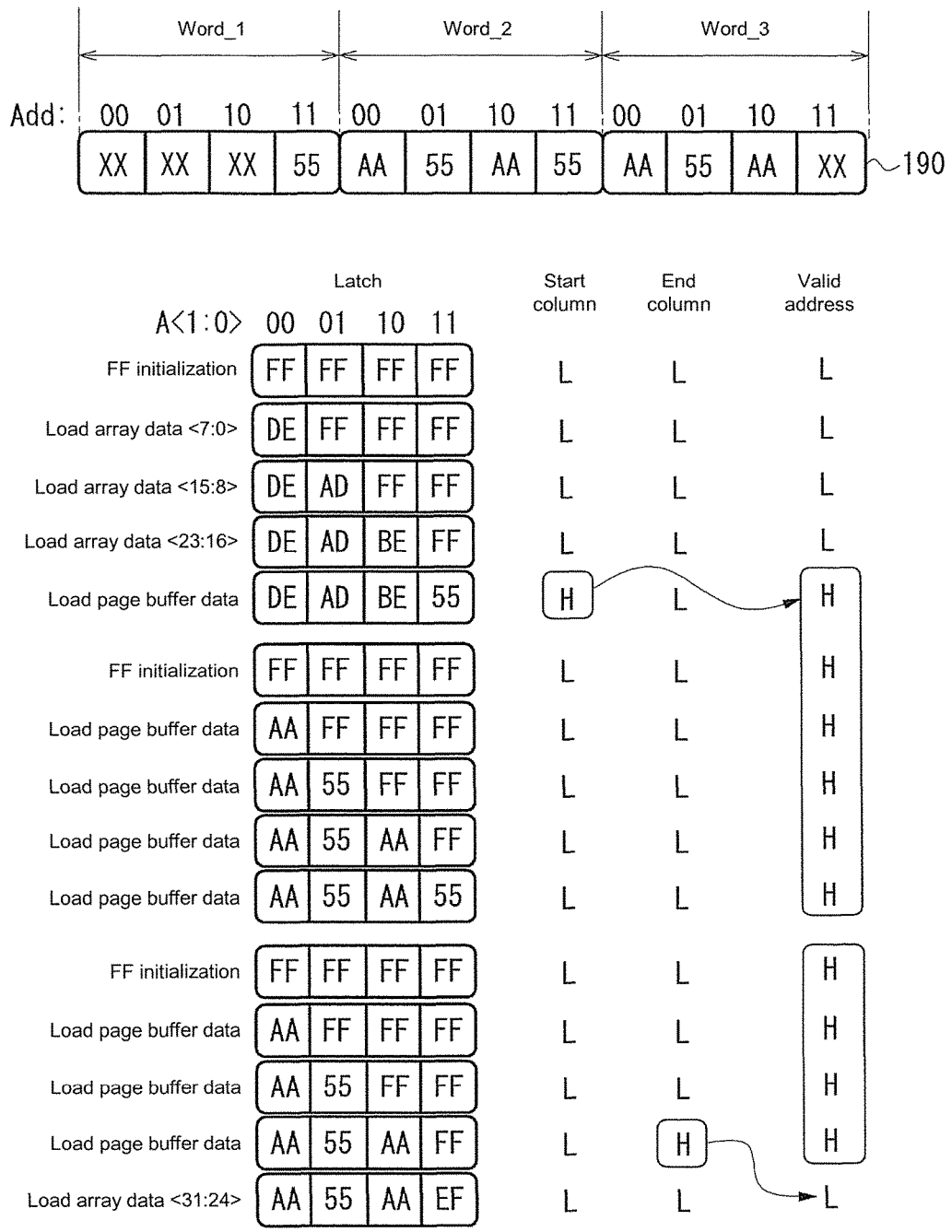
FIG. 14 is an example of writing words including unaligned format and aligned formation in the RAM mode according to the second embodiment of the invention.

Then, an operation of continually writing the unaligned word data and the aligned word data of FIG. 12 is shown in FIG. 14. It is assumed that the word_1, the word_2 and the word_3 are sequentially written.

The byte addressing part 240 detects valid addresses in the word_1-word_3, i.e. the addresses of the writing data according to an input start column address and a size of the writing data. In a preferred exemplary example, the byte addressing part 240 saves the start column address and an end column address (calculated by adding the start column address with the size of the writing data) in a register, and detects whether a value of an address counter obtained when the bytes of the word_1-the word_3 are accessed is consistent with the start column address and the end column address.

In the writing operation of the word_1, the data setting part 230 initializes all of the bytes of the latch 210 to "FF". Since the three bytes of the addresses "00"-"10" in the word_1 do not include the writing data, a start column flag and an end column flag of the byte addressing part 240 are all the L level, and a valid address flag is also the L level. The data setting part 230 sets data of the three bytes read from selected memory cell units (selected according to the input row address and column addresses) in the latch 210 when the valid address flag is the L level. The read operation of the selected memory cell units is performed under control of the controller 140 which is the same to an ordinary read operation. The example of FIG. 14 represents a status that the data of the three bytes "DE", "AD", "BE" read from the selected memory cell units are set in the latch 210.

When the byte addressing part 240 accesses the address "11" of the word_1, a value of the address counter is consistent with a start column of the register, so that the start column flag is changed from the L level to the H level, and the valid address flag is changed to the H level accordingly. The data setting part 230 loads the data of the fourth byte from the page buffer 190 in response to the situation that the valid address flag is changed to the H level, and sets the data in the latch 210. When accessing of the fourth bytes of the word_1 is ended, the data set in the latch 210 is written to the selected memory cell units.

Then, the word_2 is written. It should be noted that the valid address flag of the byte addressing part 240 is maintained to the H level. Therefore, the data setting part 230 reads data of each byte of the word_2 from the page buffer 190 in response to a situation that the byte addressing part 240 accesses each byte of the word_2, and sequentially sets the same in the latch 210. As a result, in the process of writing the word_2, the data of four bytes of the page buffer 190 is written to the selected memory cell units.

Then, the word_3 is written. Data of one byte to three byte of the word_3 is respectively set in the latch 210. When the third byte of the word_3 is accessed, since the value of the address counter is consistent with the end column of the register, the end column flag of the byte addressing part 240 is changed from the L level to the H level at the following fourth byte. Accordingly, the valid address is changed from the H level to the L level. The data setting part 230 is in response to the situation that the valid address is changed to the L level, controller 140 reads data of the fourth byte from the selected memory elements and sets the same to the fourth byte of the latch 210.

In this way, in the RAM mode, a range of the valid address is set by detecting the start column and the end column, in case of the range of the valid address (the valid address flag is H), data is loaded from the page buffer 190, and in case of a range except the above range, data is loaded from the memory elements, and the writing data is set to the latch 210, so as to implement continuous writing of unaligned word data and aligned word data.

Figure 15:
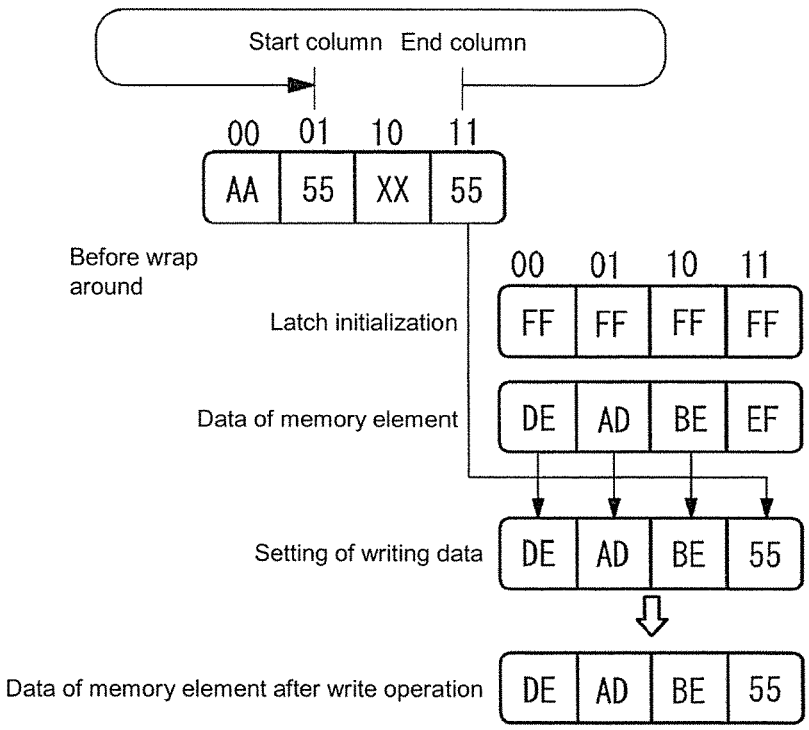
FIG. 15 is an example of wrap around writing in the RAM mode according to the second embodiment of the invention.
Figure 16:
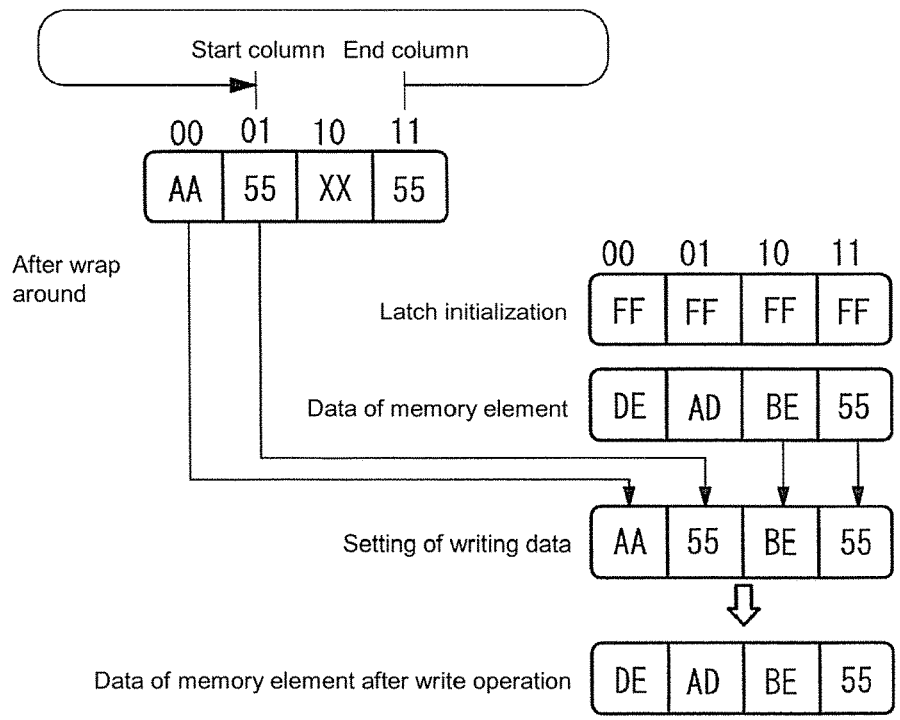
FIG. 16 is an example of wrap around writing in the RAM mode according to the second embodiment of the invention.
Figure 17:
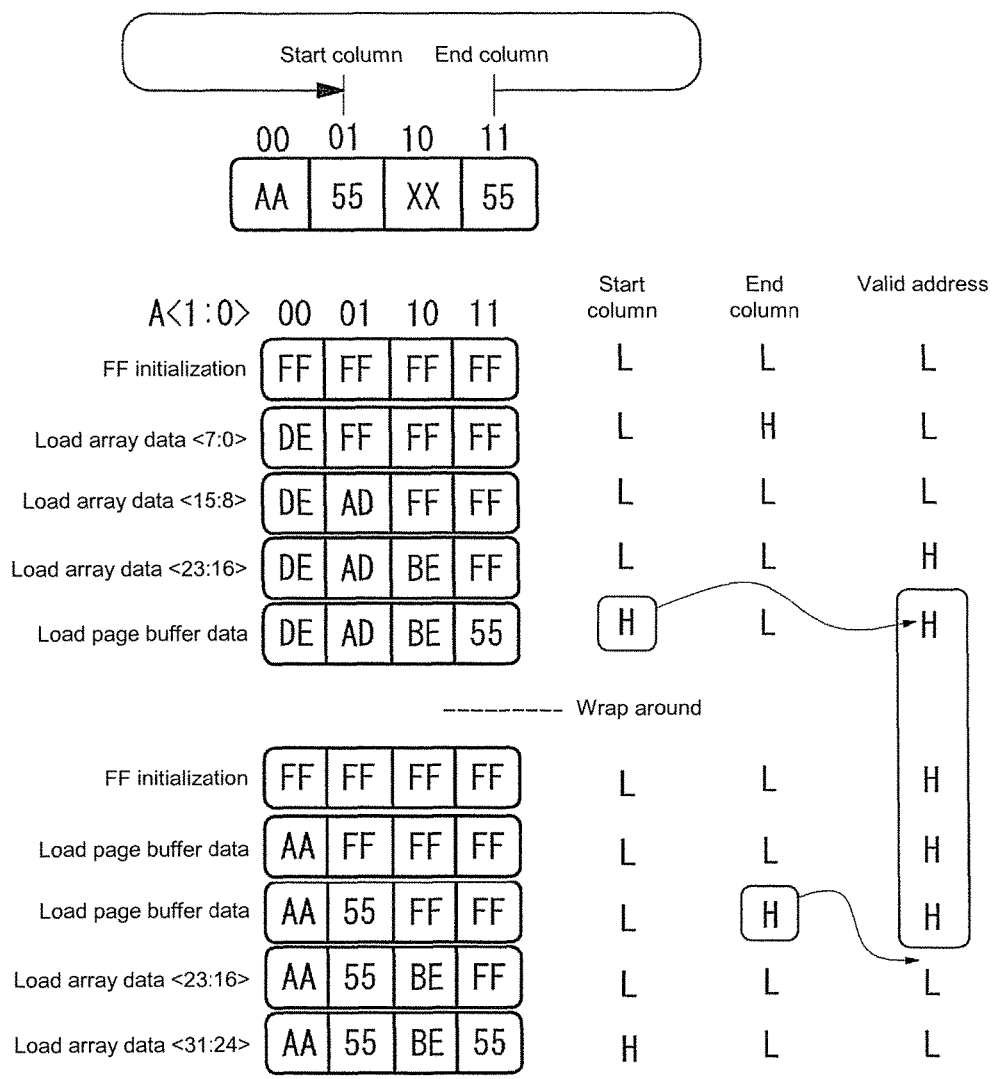
FIG. 17 is an example of wrap around writing in the RAM mode according to the second embodiment of the invention.

Then, the non-volatile semiconductor memory 100 of the present embodiment performs writing of a wrap around sequence in the RAM mode is described below. Writing of the wrap around sequence refers to continuous writing from a decided start column address of the page buffer to a decided end column address. FIG. 15 to FIG. 17 are examples of implementing writing of the wrap around sequence. It is assumed that the fourth byte of the decided word is the start column address, and the second byte of the word is the end column address.

Before the wrap around, i.e. until the third byte, the valid address flag is the L level, so that data of the three bytes read from the selected memory elements are preserved in the latch 210. Since the value of the address counter obtained when access of the first byte is ended (i.e. the value of the address counter of the second byte) is consistent with the end column, the end column flag is changed to the H level, though since the start column address is not changed to the H level, the change of the end column address is neglected. In case of the fourth byte, the value of the address counter is consistent with the start column, the start column flag is changed from the L level to the H level, and the valid address flag is changed to the H level accordingly, and the data of the fourth byte of the page buffer is loaded to the latch 210. Moreover, the data set in the latch 210 is written to the selected memory elements.

Then, under the state that the valid address flag is maintained to the H level, the write operation in unit of word is performed. During such period, the valid address flag is the H level, so that the word data held by the page buffer 190 is set in the latch 210. Moreover, as shown in FIG. 16, when the wrap around is returned to the decided word, data of the previous two bytes is set in the latch 210, and the value of the address counter obtained when access of the second byte is ended is consistent with the end column, the end column flag is changed to the H level, and the valid address flag is changed to the L level accordingly. In this way, in case of access of the third byte, data is read from the selected memory elements, and the data is set in the latch 210. In case of access of the fourth byte, the start column flag is changed to the H level, though since the end column is detected, the change of the start column flag is neglected.

As described above, by executing the operation modes corresponding to the RAM mode and the flash mode, the non-volatile semiconductor memory of the present embodiment may provide a user interface with high flexibility.

In the aforementioned embodiments, the memory elements used for constructing the memory array are, for example, variable resistance type memory elements, though as long as the memory elements other than the variable resistance type may implement random access and can be overwritten by writing data "0", "1", the memory elements are also considered to be within the scope of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile semiconductor memory device, comprising:
   a memory array, comprising a plurality of memory elements;
   a selection part, selecting the memory elements of the memory array based on address data;
   an operation mode selection part, selecting any one of a first operation mode and a second operation mode, wherein the first operation mode is a mode adapted to overwrite data of the memory element according to writing data, and the second operation mode is a mode adapted to overwrite data of the memory element when the writing data is a first value, and prohibit overwrite when the writing data is a second value; and
   a write control part, writing the writing data to the memory element selected by the selection part according to the first operation mode or the second operation mode selected by the operation mode selection part,
   wherein under the first operation mode, when the writing data is "0", the data of the memory element is overwritten by "0", and when the writing data is "1", the data of the memory element is overwritten by "1", and under the second operation mode, when the writing data is "0", the data of the memory element is overwritten by "0", and when the writing data is "1", overwriting of the data of the memory element is prohibited,
   wherein when the write control part selects the second operation mode, a logic AND of the writing data and data read from the selected memory element is determined, and data of the determined logic AND is written to the selected memory element.

2. The non-volatile semiconductor memory device as claimed in claim 1, wherein
   the write control part comprises: a data holding part, holding the writing data; and a data setting part, setting the writing data held by the data holding part in a latch circuit, wherein when the data setting part selects the second operation mode, the data setting part converts the writing data held by the data holding part, and sets the converted writing data in the latch circuit,
   the write control part writes the selected memory element based on the writing data set in the latch circuit.

3. The non-volatile semiconductor memory device as claimed in claim 2, wherein the data holding part is adapted to hold data of n bits, and the data setting part sets the writing data of p bits held by the data holding part in the latch circuit, wherein p is greater than or equal to 2 and smaller than n.

4. The non-volatile semiconductor memory device as claimed in claim 2, wherein the data holding part is adapted to hold data of n bytes, and the data setting part sets the writing data of p bits held by the data holding part in the latch circuit, wherein p is greater than or equal to 2 and smaller than n.

5. The non-volatile semiconductor memory device as claimed in claim 2, wherein
   the write control part comprises an address detecting part, and the address detecting part detects an address of the writing data held by the data holding part,
   the data setting part sets the writing data with the address detected by the address detecting part in the latch circuit.

6. The non-volatile semiconductor memory device as claimed in claim 5, wherein when the second operation mode is selected, the data setting part initializes the latch circuit, and sets the writing data with the address detected by the address detecting part in the latch circuit.

7. The non-volatile semiconductor memory device as claimed in claim 5, wherein when the first operation mode is selected, the data setting part initializes the latch circuit, and selectively sets the writing data held by the data holding part or data read from the selected memory element in the latch circuit according to the address detected by the address detecting part.

8. The non-volatile semiconductor memory device as claimed in claim 7, wherein the address detecting part detects a valid address range of the writing data, the data setting part sets the writing data held by the data holding part and located within the valid address range in the latch circuit, and sets data read from the selected memory element and located outside the valid address range in the latch circuit.

9. The non-volatile semiconductor memory device as claimed in claim 8, wherein the address detecting part holds column information representing a start column and an end column based on an input column address and a size of the writing data, and sets the valid address range according to whether an address value obtained in access of the data holding part is consistent with the column information.

10. The non-volatile semiconductor memory device as claimed in claim 8, wherein the write control part enables writing of a wrap around sequence based on the valid address range.

11. The non-volatile semiconductor memory device as claimed in claim 1, wherein the memory element is a reversible and non-volatile variable resistance element.

* * * * *